United States Patent
Mazarakis et al.

(10) Patent No.: US 9,602,087 B2
(45) Date of Patent: Mar. 21, 2017

(54) LINEAR TRANSFORMER DRIVER FOR PULSE GENERATION WITH FIFTH HARMONIC

(71) Applicants: Sandia Corporation, Albuquerque, NM (US); Alexander A. Kim, Tomsk (RU); Vadim A. Sinebryukhov, Tomsk (RU); Sergey N. Volkov, Tomsk (RU); Sergey S. Kondratiev, Tomsk (RU); Vitaly M. Alexeenko, Tomsk (RU); Frederic Bayol, Thegra (FR); Gauthier Demol, Thegra (FR)

(72) Inventors: Michael G. Mazarakis, Albuquerque, NM (US); Alexander A. Kim, Tomsk (RU); Vadim A. Sinebryukhov, Tomsk (RU); Sergey N. Volkov, Tomsk (RU); Sergey S. Kondratiev, Tomsk (RU); Vitaly M. Alexeenko, Tomsk (RU); Frederic Bayol, Thegra (FR); Gauthier Demol, Thegra (FR); William A. Stygar, Albuquerque, NM (US); Joshua Leckbee, Albuquerque, NM (US); Bryan V. Oliver, Albuquerque, NM (US); Mark L. Kiefer, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 365 days.

(21) Appl. No.: 14/305,186

(22) Filed: Jun. 16, 2014

(65) Prior Publication Data

US 2014/0354076 A1 Dec. 4, 2014

Related U.S. Application Data

(63) Continuation-in-part of application No. 13/530,403, filed on Jun. 22, 2012, now Pat. No. 9,000,625.

(51) Int. Cl.
H03K 3/00 (2006.01)
H03K 4/94 (2006.01)
H03K 3/57 (2006.01)

(52) U.S. Cl.
CPC .............. H03K 4/94 (2013.01); H03K 3/57 (2013.01)

(58) Field of Classification Search
CPC .................................. H03K 4/94; H03K 3/57
See application file for complete search history.

(56) References Cited

U.S. PATENT DOCUMENTS 7,679,297 B1 * 3/2010 Stygar ..................... G21B 1/21
315/5.41

FOREIGN PATENT DOCUMENTS

SE WO 9628887 A1 * 9/1996 ............... H03K 3/53

OTHER PUBLICATIONS

Kim, A. A. et al., "Square Pulse LTD with $5^{th}$ Harmonic Bricks," Pulsed Power Conference (PPC), Jun. 16-21, 2013, San Francisco, 19th IEEE, 2013, 3 pages.

(Continued)

*Primary Examiner* — Daniel Cavallari
(74) *Attorney, Agent, or Firm* — Blakely Sokoloff Taylor & Zafman; Kevin W. Bieg

(57) ABSTRACT

A linear transformer driver includes at least one ferrite ring positioned to accept a load. The linear transformer driver also includes a first, second, and third power delivery module. The first power delivery module sends a first energy in the form of a first pulse to the load. The second power delivery module sends a second energy in the form of a second pulse to the load. The third power delivery module sends a third energy in the form of a third pulse to the load. The linear transformer driver is configured to form a flat-top pulse by the superposition of the first, second, and third (Continued)

pulses. The first, second, and third pulses have different frequencies.

20 Claims, 12 Drawing Sheets

(56) References Cited

OTHER PUBLICATIONS

Kim, A. A. et. al., "Gas Switch Performance Depending on Current in the Circuit," 14$^{th}$ International Symposium on High-Current Electronics, Institute of High Current Electronics, 2006, Tomsk, Russia, pp. 297-300.

Kim, A. A. et. al., "Pulse Shaping in Square Pulse LTD," in 3$^{rd}$ *International Congress on Radiation Physics and Chemistry of Condensed Matter, High Current Electronics and Modification of Materials with Particle Beams and Plasma Flows*: Abstracts, 2012, Institute of High Current Electronics SB RAS, Tomsk, Russia, pp. 231-232.

* cited by examiner

LINEAR TRANSFORMER DRIVER FOR PULSE GENERATION WITH FIFTH HARMONIC

CROSS-REFERENCE TO RELATED APPLICATION

This application is a Continuation-in-Part of, and claims priority to U.S. patent application Ser. No. 13/530,403 filed on Jun. 22, 2012, the contents of which are hereby incorporated by reference.

STATEMENT REGARDING FEDERALLY SPONSORED RESEARCH

This invention was made with Government support under Contract No. DE-AC04-94AL85000 between Sandia Corporation and the U.S. Department of Energy. The U.S. Government has certain rights in this invention.

TECHNICAL FIELD

This disclosure relates generally to pulse generation and in particular but not exclusively, relates to linear transformer drivers that generate square pulses.

BACKGROUND INFORMATION

Linear Transformer Drivers ("LTD") are a class of accelerators that are capable of generating high current, high voltage pulses. High power pulses are useful in applications such as high current Z-pinch inertial confinement fusion ("ICF"), Z-pinch inertial fusion energy ("IFE") drivers, flash radiography, and high-power microwaves. One approach to making an LTD includes constructing an array of power delivery modules that are connected in parallel. An accelerator cavity encloses the array of power delivery modules and a load is positioned within a core at the center of the cavity to receive high power pulses generated by the array of power delivery modules.

In this arrangement, a high power pulse is created by switching the power delivery modules and inductively adding the pulses at (relatively) low voltage through low inductance transfer and soft iron or other ferromagnetic material core isolation. Although this configuration is capable of generating high power pulses, the pulses are generally sine shaped output pulses that may not be well suited for some applications. For example, in radiography, a pulse with a fixed voltage (flat top) is desired. Hence, a more suitable power pulse would have a flat or trapezoidal (rising or falling) top. Therefore, an LTD that could generate high power pulses that also had flat or trapezoidal tops is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for generating pulses with a linear transformer driver ("LTD") are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
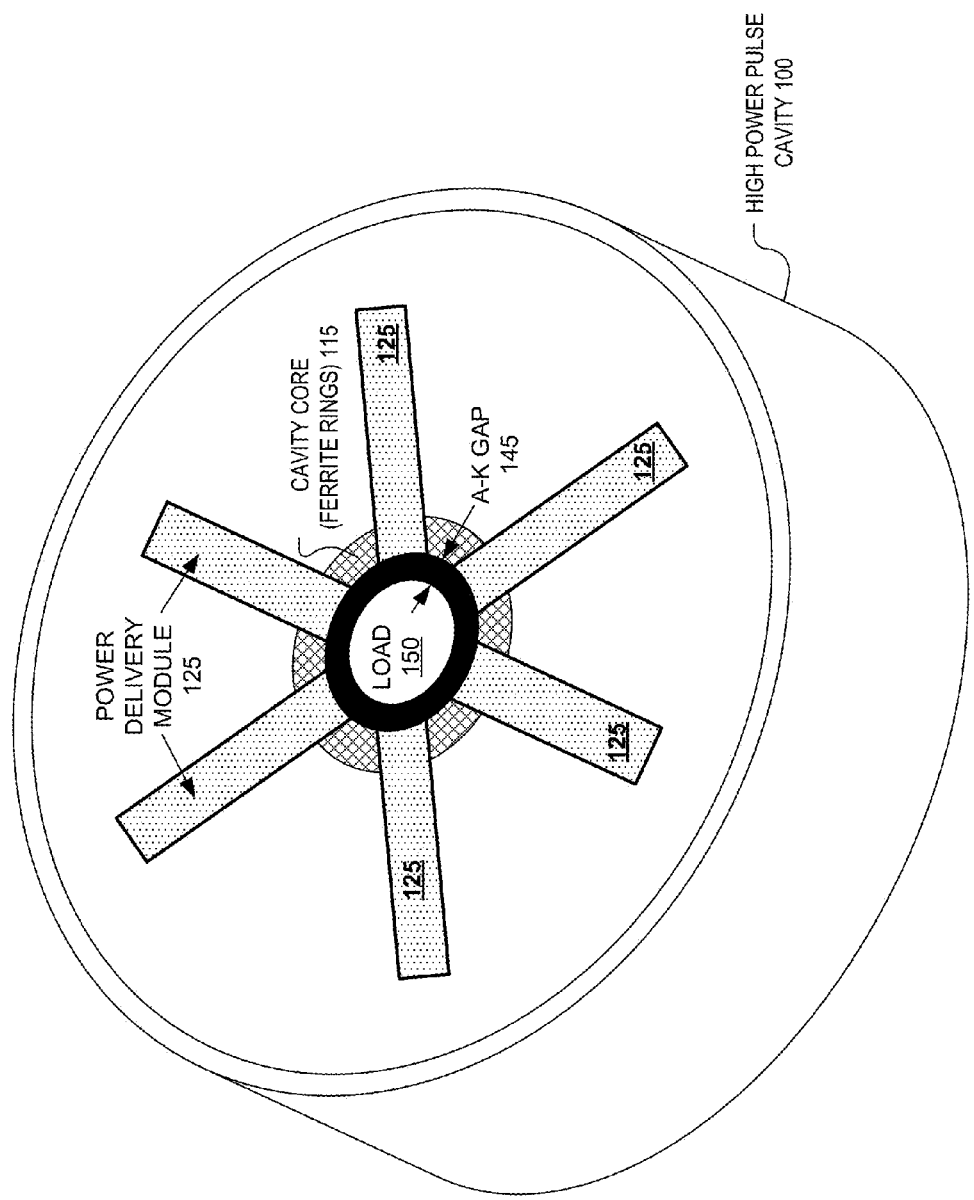
FIG. 1A illustrates a diagram of a high power pulse cavity ("HPPC") that contains a circular array of power delivery modules.

FIG. 1A includes a high power pulse cavity ("HPPC") 100 that contains a circular array of power delivery modules 125. In the illustrated embodiment, HPPC 100 is substantially doughnut shaped and includes a cavity core 115 at the center of high power pulse cavity 100. Cavity core 115 may be made out of ferrite rings. In one embodiment, cavity core 115 includes six ferrite rings. Load 150 is positioned in cavity core 115 and each of the power delivery modules 125 are connected in parallel to deliver pulses to load 150.

More than one HPPC 100 can be positioned together in order to form a voltage adder. In this way, higher voltages can be achieved by inductively adding many stages in series. In one embodiment, HPPC 100 has steel walls and the steel walls are grounded at all times. Grounding the outside of the cavity may dramatically reduce the electrical hazard associated with the high power nature of HPPC 100. Additionally, the steel walls reduce or even virtually eliminate electro-magnetic power ("EMP") radiation from escaping HPPC 100. HPPC 100 may have a top metal cover and a plastic insulator for insulating charged parts of the power delivery modules from the cavity walls.

Figure 1B:
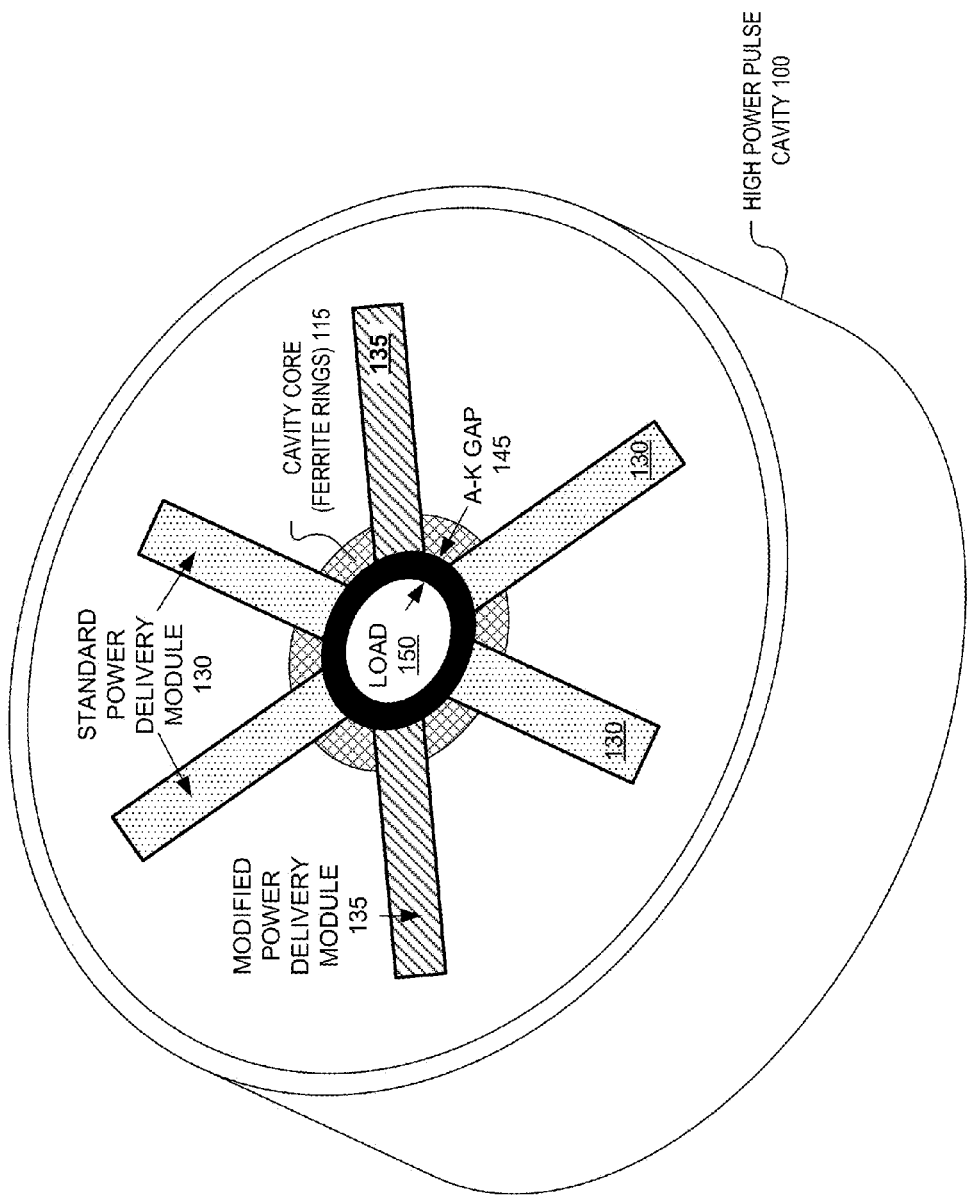
FIG. 1B illustrates an example HPPC that includes an array of standard power delivery modules ("SPDM") and an array of modified power delivery modules ("MPDM"), in accordance with an embodiment of the disclosure.

FIG. 1B illustrates an example HPPC 100 including standard power delivery module ("SPDM") 130 and modified power delivery module ("MPDM") 135. In one embodiment, an outer diameter of HPPC 100 is 204 cm. When HPPC 100 only includes power delivery modules 125 (as in FIG. 1A) that all generate pulses with the same frequency, the pulses are combined into a higher power pulse with that same frequency. The combined pulse may be substantially sinusoidal. However, in some applications, a pulse with a flatter top (e.g. a square pulse) than a sinusoidal waveform is desirable. Having an MPDM 135 connected in parallel with an SPDM 130 can generate a substantially flat-top pulse to be delivered to a particular load. Theoretical analysis and experiments indicate that having MPDM 135 configured to deliver a pulse that is approximately three times the frequency of a pulse delivered by SPDM 130 creates a pulse with a substantially flat top.

Figure 2:
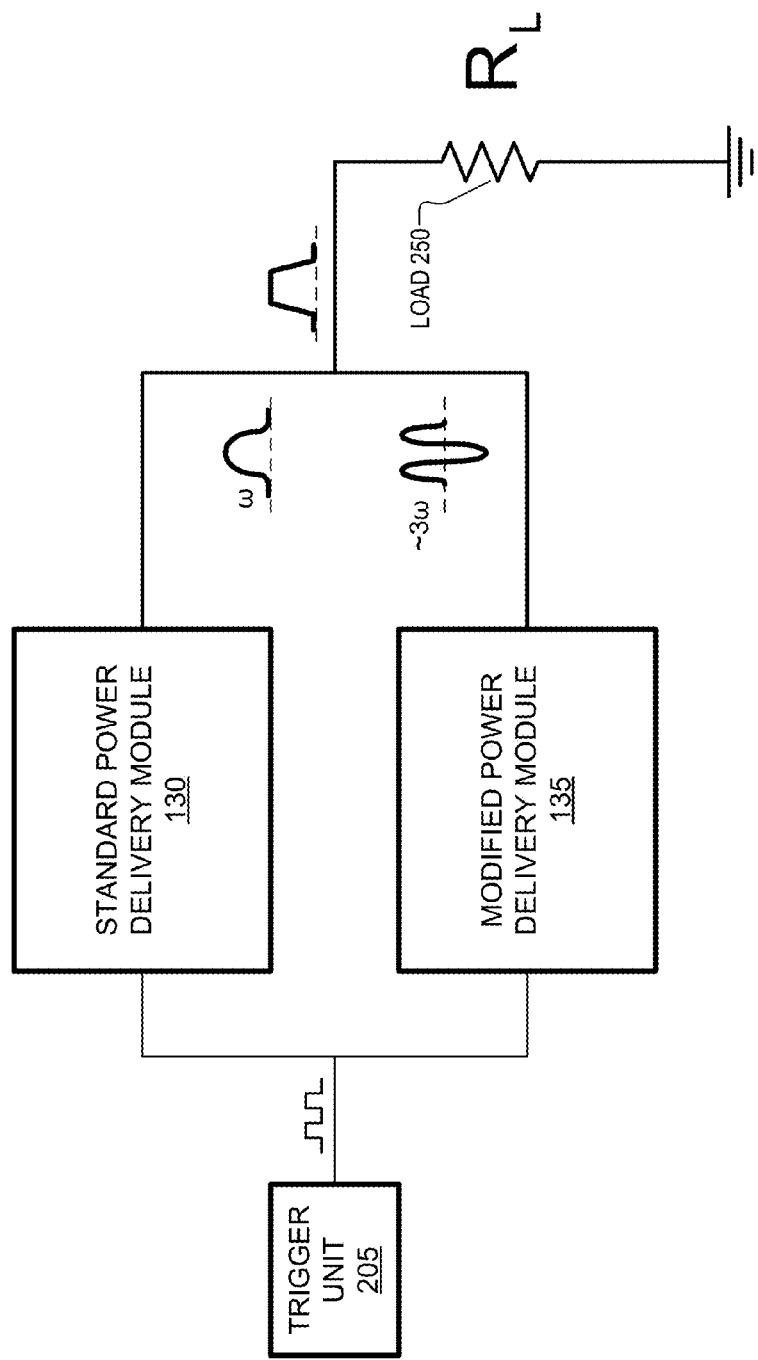
FIG. 2 shows an example block diagram including an SPDM generating a first pulse and an MPDM generating a second pulse that combines with the first pulse to form a pulse with a substantially flat-top, which is delivered to a load, in accordance with an embodiment of the disclosure.

FIG. 2 shows SPDM 130 connected in parallel with MPDM 135. SPDM 130 generates a pulse to be applied to a load, such as $R_L$ 250. MPDM 135 also generates a pulse to be applied to a load that is approximately three times the frequency of the pulse generated by SPDM 130. In the illustrated embodiment, trigger unit 205 is coupled to SPDM 130 and coupled to MPDM 135. Trigger unit 205 sends a trigger signal to SPDM 130 and to MPDM 135 to deliver a pulse to the load $R_L$ 250. Because the outputs of SPDM 130 and MPDM 135 are connected in parallel in FIG. 2, their pulses combine into a pulse with a relatively flat top. It is appreciated that although the load $R_L$ 250 is illustrated as a resistor, the load receiving the pulse may not be purely resistive.

Figure 3:
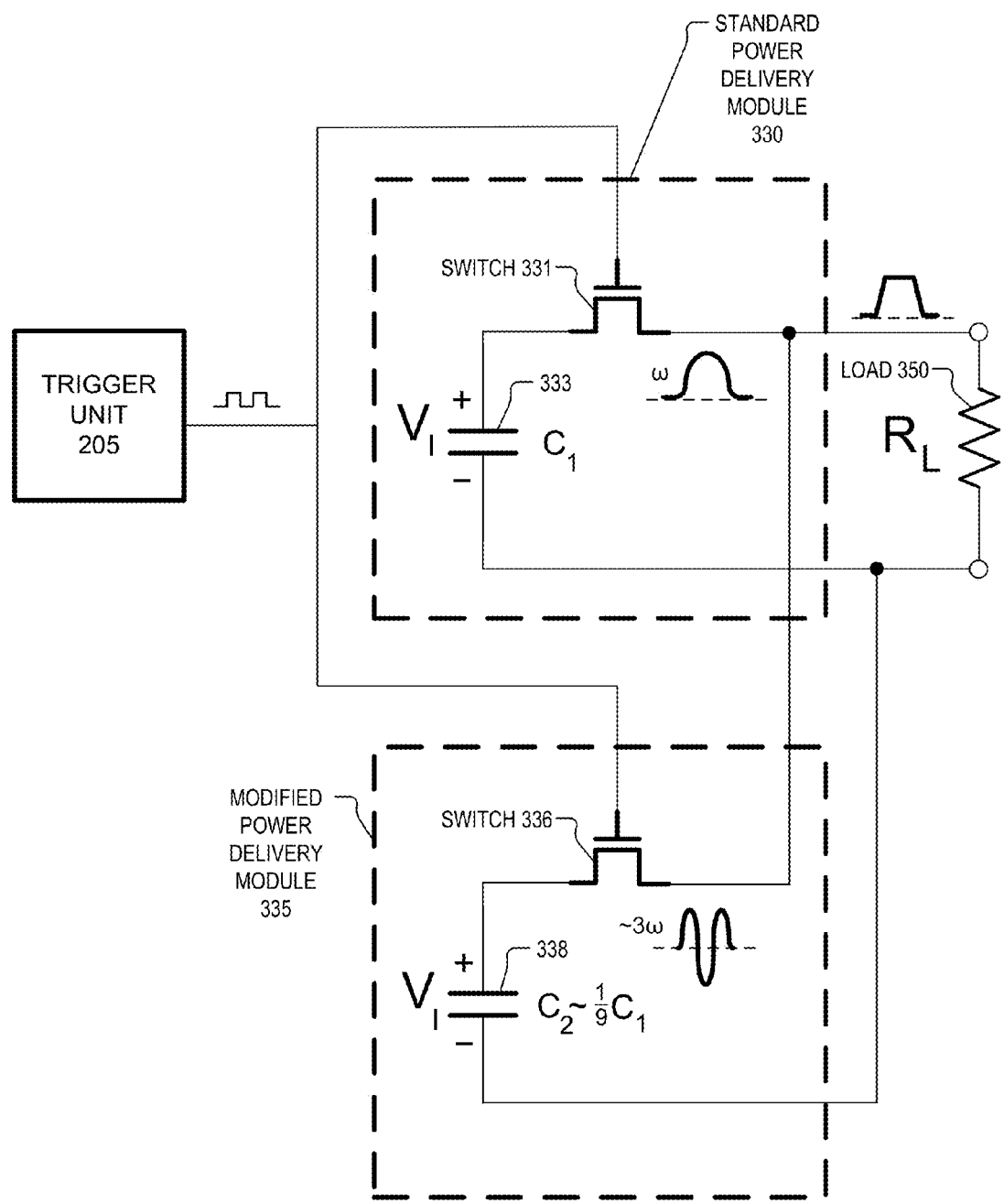
FIG. 3 shows an example block diagram illustrating one example configuration of a trigger unit, an SPDM, and an MPDM, in accordance with an embodiment of the disclosure.

FIG. 3 illustrates SPDM 330 as a possible example of SPDM 130 and MPDM 335 as a possible example of MPDM 135. SPDM 330 includes a charge storage device and a switch coupled to selectively transfer charge (in the form of a pulse) from the charge storage device to a load 350. MPDM 335 also includes a charge storage device and a switch coupled to selectively transfer charge (in the form of a pulse) from the charge storage device to the same load 350.

The illustrated embodiment of SPDM 330 includes a capacitor ($C_1$ 333) coupled to switch 331. $C_1$ 333 is charged to a voltage $V_I$ and switch 331 is activated by trigger unit 205 which allows $C_1$ 333 to discharge, generating a pulse to be delivered to load 350. The pulse may be an electromagnetic pulse and load 350 may not necessarily contact the conductors that deliver the pulse. The charging circuit and hardware that may be used to charge $C_1$ 333 is not shown as to not obscure the schematic. The frequency of the pulse delivered by SPDM 330 is ω, as illustrated.

The illustrated embodiment of MPDM 335 includes a capacitor ($C_2$ 338) coupled to switch 336. $C_2$ 338 is charged to a voltage $V_1$ and switch 336 is activated by trigger unit 205, which allows $C_2$ 338 to discharge and generate a pulse to be delivered to load 350. In the illustrated embodiment, $C_2$ 338 and $C_1$ 333 are both charged to the same voltage ($V_I$), but they may be charged to different voltages. The charging circuit and hardware that may be used to charge $C_2$ 338 is not shown as to not obscure the schematic. The frequency of the pulse delivered by MPDM 335 is ~3ω, as illustrated. Experiments and theory indicate that having MPDM 335 configured to deliver a pulse that is approximately three times the frequency of a pulse delivered by SPDM 330 creates a pulse with a substantially flat top. Although FIG. 3 does not depict a core (e.g. cavity core 115), those skilled in the art appreciate that a core may encircle conductors that are routed toward load 350.

In the illustrated embodiment, trigger unit 205 is coupled to switch 331 and 336 in parallel. In other examples, switch 331 and switch 336 may be coupled to trigger unit 205 individually, with separate conductors. In the illustrated embodiment, trigger unit 205 may broadcast a trigger signal to both switch 331 and switch 336, which will trigger SPDM 330 and MPDM 335 to deliver their pulses simultaneously. In other examples, switch 331 may receive a trigger signal from trigger unit 205 at a different time than switch 336 receives a trigger signal. Trigger unit 205 may be configured to deliver triggering signals (either analog or digital) to switch 331 and 336 at different times in order to stagger the pulses delivered to load 350 to achieve a desired waveform. It shall be appreciated that trigger unit 205 may also be connected to more than one (i.e. arrays) of SPDM 330 and MPDM 335 in order to orchestrate or synchronize the delivery of multiple pulses to load 350.

Figures 4A, 4B:
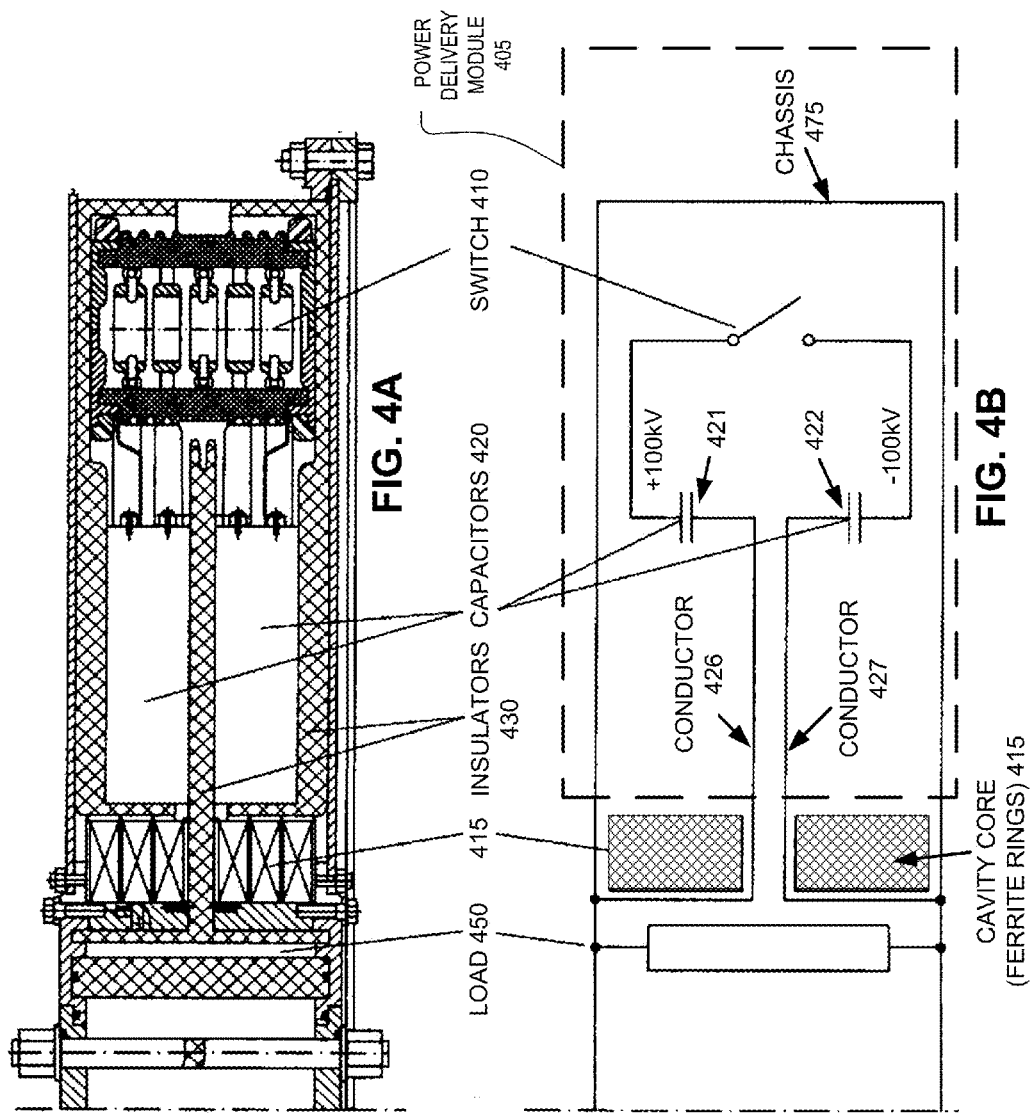
FIG. 4A illustrates a side section drawing of a power delivery module that includes a test load, in accordance with an embodiment of the disclosure.
FIG. 4B shows a block diagram schematic that corresponds with FIG. 4A, in accordance with an embodiment of the disclosure.

FIG. 4A illustrates a side section drawing of a power delivery module that includes a test load, in accordance with an embodiment of the disclosure. All or a portion of the structure illustrated in FIG. 4A may be used in the respective SPDMs and MPDMs. FIG. 4A shows load 450 as a liquid resistor, which can be used for test and measurement purposes. However, it is appreciated that illustrated load 450 resistor may be replaced with a different load that receives electromagnetic pulses and does not necessarily receive power by virtue of being wired to conductors.

FIG. 4A includes a cavity core 415, insulators 430, capacitors 420, and a switch 410. In the illustrated embodiment, cavity core 415 includes six ferrite rings. Three of the ferrite rings (each illustrated by an "X" within a rectangle) are positioned below the portion of insulator 430 that separates capacitors 420. Still referring to the illustrated embodiment, three of the ferrite rings in cavity core 415 are positioned below the portion of insulator 430 that separates capacitors 420.

FIG. 4B shows a block diagram schematic that corresponds with FIG. 4A, in accordance with an embodiment of the disclosure. FIG. 4B includes a power delivery module 405 that includes switch 410, capacitors 420, conductor 426, and conductor 427. FIG. 4B also shows cavity core 415. In one embodiment, cavity core 415 includes a first ferrite ring stacked co-axially with a second ferrite ring with an insulator 430 separating the first ferrite ring and the second ferrite ring.

In the illustrated embodiment, cavity core 415 includes a first group of three ferrite rings stacked co-axially with a second group of three ferrite rings with insulator 430 separating the two stacks. The cavity core may be made of ET3425 iron tape with a thickness $\delta$=50-80 μm. In one embodiment, the length of its centerline (measured as the length of the core mean circumference) is 1 ~1.2 m. In the illustrated embodiment, the total cross section of iron in the six rings is S ~53 cm$^2$. At passive pre-magnetization, the volt-second integral of this core may be $VS_{CORE}$ ~17 mV s.

Charging circuitry (not shown) may charge capacitor 421 to a first voltage (e.g. 100 kV) and charge capacitor 422 to a second voltage (e.g. −100 kV). Switch 410 is coupled in series between capacitor 421 and capacitor 422. Capacitor 421 and capacitor 422 are configured to deliver a pulse to the load via conductor 426 and conductor 427. Capacitors 421 and 422 may have the same capacitance. In the illustrated embodiment, conductor 426 is routed from capacitor 421, through the first (top) stack of ferrite rings, to a chassis 475. Also in the illustrated embodiment, conductor 427 is routed from capacitor 422, through the second (bottom) stack of ferrite rings, to chassis 475. The first ferrite ring and the second ferrite ring are positioned to force the pulse to load 450 by temporarily isolating the pulse from an electrical ground. In other words, the first ferrite ring and the second ferrite ring may act as a "choke" to the pulse.

Chassis 475 may be a steel chassis that is substantially doughnut shaped. Chassis 475 may be at ground potential at all times. Capacitor 421 and capacitor 422 are configured to deliver a pulse to the load (when switch 410 closes), where the pulse includes the energy stored in capacitors 421 and 422 by the charging circuitry. In one embodiment, TDK ceramic capacitors are used in an MPDM of power delivery module 405 and GA 35460 oil-filled capacitors are used in a SPDM of power delivery module 405. Other capacitors may be used.

Figure 5:
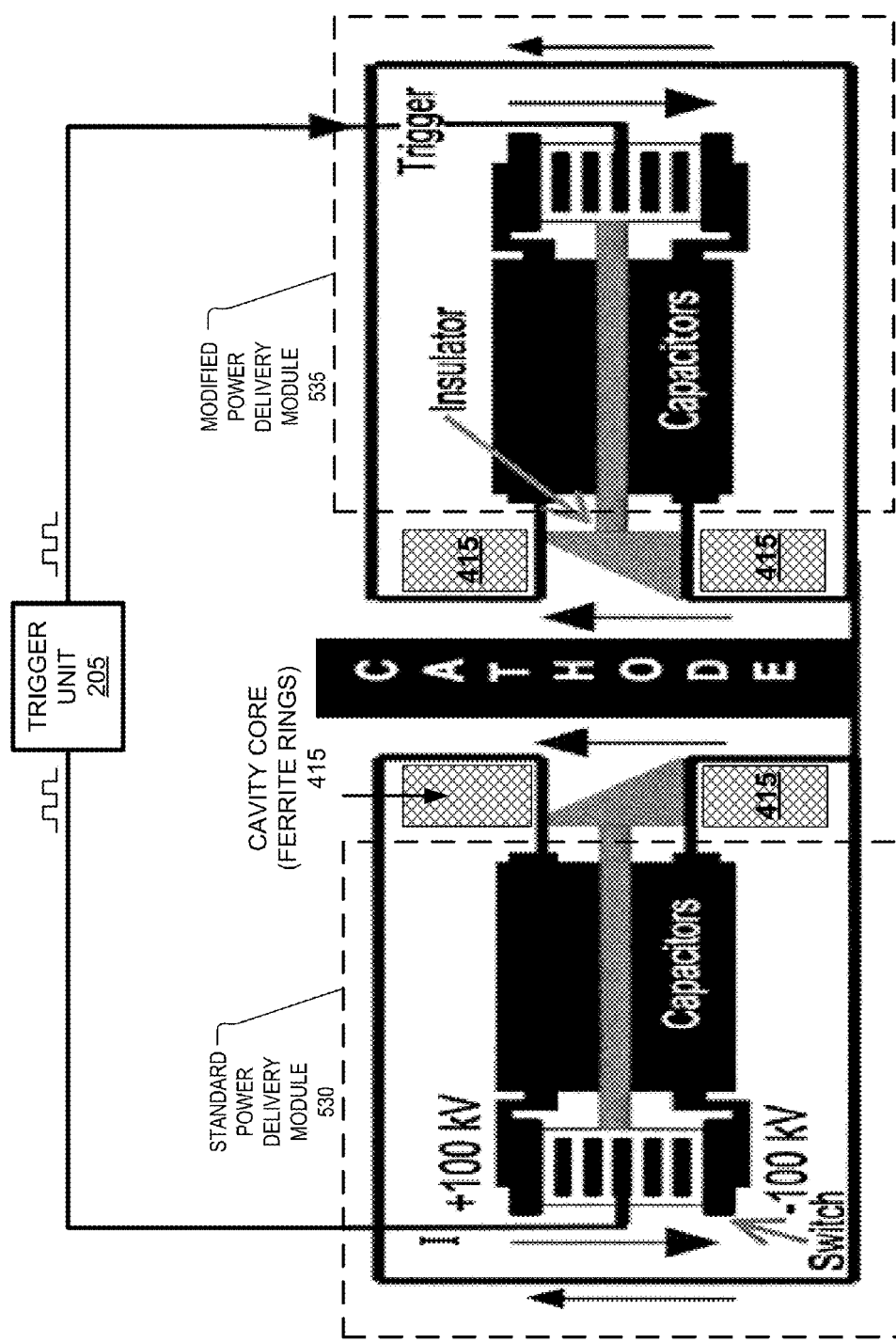
FIG. 5 illustrates a block diagram of a side section of an SPDM, an MPDM, and an example load, in accordance with an embodiment of the disclosure.

FIG. 5 illustrates a block diagram of a side section of an SPDM 530, an MPDM 535, and an example load, in accordance with an embodiment of the disclosure. SPDM 530 and MPDM 535 may be examples of SPDM 130 and MPDM 135, respectively. In FIG. 5, instead of a wired resistor (e.g. load 450), the load is now the coaxial line formed by the inner cylindrical surface of a cavity (e.g. HPPC 100) and a central (cathode) cylindrical electrode. The pulses from SPDM 530 and MPDM 535 are applied across an insulator that separates the anode and cathode output electrodes (A-K gap) of the cavity.

In one embodiment, trigger unit 205 is coupled to transmit a trigger signal to the switch in SPDM 530 and to the switch in MPDM 535. The trigger signal may be sent to both switches simultaneously. In one embodiment, the trigger signal is a trigger pulse of 100 kV. This trigger pulse arrives into the middle plane of the switches, which causes the switches to close and the capacitors in both SPDM 530 and MPDM 535 to discharge toward the walls (e.g. chassis 475) of the cavity (e.g. HPPC 100), which is grounded at all times. The pulse formed by the energy discharge of the capacitors of SPDM 530 combines with the pulse formed by the energy discharge of the capacitors of MPDM 535 to form a combined pulse. The combined pulse may have a substantially flat-top because of the combination of the SPDM pulse (ω) and the MPDM pulse (~3ω). The ferromagnetic cavity core 415 has the appropriate cross-sectional area to block the pulse from going to ground (chassis) and forcing it to be applied across a plastic insulator of the A-K gap for a duration between 75 and 200 ns. This induces an opposite sign pulse on the cathode electrode, which propagates upstream through the coaxial transmission line. When the core saturates, any remaining energy goes to ground. In FIG. 5, arrows show the current direction in each conductor.

In order to achieve a fast rise time output pulse (e.g. ~70-150 ns), the inductance of each power delivery module may need to be kept as low as possible. The inductance of each power delivery module 405 is the sum of the inductance of capacitor 421 and capacitor 422, the inductance of switch 410, the inductance of the connection between each capacitor and switch 410, and the inductance of the conductors 426 and 427. Switch 410 and capacitors 421 and 422 may be connected with circuit bushes with an inductance of ~60 nH. In one embodiment, the circuit bushes are made from aluminum plates. Conductors 426 and 427 may also be aluminum plates and complete the circuit loop by bringing the output pulse of a power delivery module 405 to load 450 or to the anode or cathode electrode of the A-K gap. Capacitors 421 and 422 may each have an inductance of ~50 nH and switch 410 may have an inductance of ~120 nH. The total inductance of each power delivery module 405 up to the ferromagnetic core 415 may be ~230 nH. SPDM 530 and MPDM 535 may also have a total inductance of approximately ~230 nH.

Still referring to FIG. 5, a first conductor is routed from a top capacitor in SPDM 530, through the first (top) stack of ferrite rings, to a chassis. A second conductor is routed from a bottom capacitor in SPDM 530, through the second (bottom) stack of ferrite rings, to the chassis. Also in the illustrated embodiment, a third conductor is routed from a top capacitor in MPDM 535, through the first stack of ferrite rings, to the chassis. A fourth conductor is routed from a bottom capacitor in MPDM 535, through the second stack of ferrite rings, to the chassis. In one embodiment (not shown), the first conductor and the third conductor may be joined together for at least a portion of their respective routings. In one embodiment (not shown), the second conductor and the fourth conductor are joined together for at least a portion of their respective routings.

As discussed above, to achieve a substantially flat-top pulse, the MPDMs may be configured to deliver a pulse that is approximately three times the frequency as a pulse delivered by the SPDMs. The idea of the flat-top (Square Pulse) LTD is based on the Fourier theorem, which states that any waveform can be reproduced by the superposition of a series of sine and cosine waves. In particular, the constant function $f(x)$ for $0 \leq x \leq \pi$ defined as $$f(x) = \frac{\pi}{4}, \tag{1}$$

can be reproduced as follows $$f(x) = \sum_{p=1}^{p_{max}} \frac{\sin(2p-1)x}{2p-1}, \tag{2}$$

where $p_{max}=\infty$. For $p_{max}=2$, the equation (2) can be represented in the form $$f_2(x) = \sin x + \frac{1}{a}\sin 3x, \tag{3}$$

where a=3. If a in Eq. (3) increases from 3 to ~9, the top of the pulse flattens.

If the function $f_2(x)$ is the current in the load, in order to produce this current pulse the driving circuit (e.g. a combination of MPDMs and SPDMs) has to deliver to the load two sine pulses with different frequencies, $\omega_1$ and $\omega_2 \sim 3\omega_1$. The amplitude of the current pulse with the frequency $\omega_2$ must be less than the one with the frequency $\omega_1$. The LTD architecture is convenient for this kind of pulse shaping because each cavity (e.g. HPPC 100) may include multiple power delivery modules connected in parallel. The output LTD pulse can have a flat top if the power delivery modules in the cavity are of two different kinds (e.g. SPDMs and MPDMs). SPDMs deliver the main sinusoidal pulse into the load, and MPDMs deliver a pulse that helps flatten the top of the main sinusoidal pulse.

Figure 6:
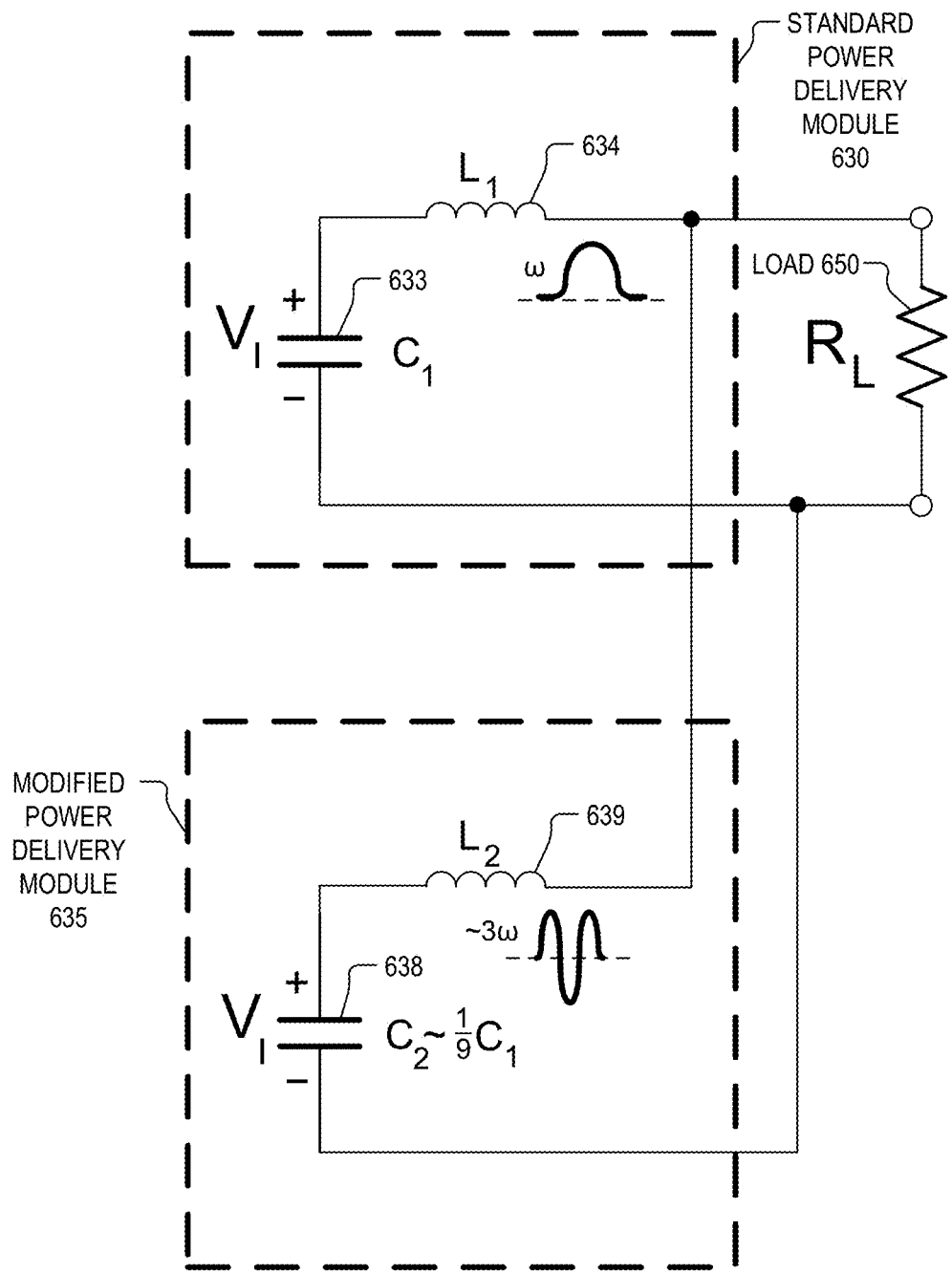
FIG. 6 shows a block diagram schematic that models the electrical characteristics of an example SPDM and an example MPDM, in accordance with an embodiment of the disclosure.

The simplified block diagram electrical circuit that models the electrical characteristics of an example SPDM (e.g. SPDM 330 and 530) and an example MPDM (e.g. MPDM 335 and 535) is shown in FIG. 6. FIG. 6 includes standard capacitor ($C_1$) 633 and standard inductor ($L_1$) 634 that model the respective capacitance and inductance of SPDM 630. FIG. 6 also includes modified capacitor ($C_2$) 638 and modified inductor ($L_2$) 639 that model the respective capacitance and inductance of MPDM 635. SPDM 630 is connected in parallel with MPDM 635 to deliver a flat-top pulse to load ($R_L$) 650.

FIG. 6 may also be an appropriate model for an LTD that has an array of SPDMs 630 and an array of MPDMs 635 connected in parallel to deliver a pulse to load 650. To model that case, standard capacitor 633 would be multiplied by s (which signifies the number of SPDMs 630 in the array) and standard inductor 634 would be divided by s. Also in that case, modified capacitor 638 would be multiplied by m (which signifies the number of MPDMs 635 in the array) and modified inductor 639 would be divided by m.

If it is assumed that SPDM 630 is matched to the cavity load, the following conditions may assist in describing the circuit model in FIG. 6:

$$\sqrt{\frac{L_1/s}{sC_1}} = \frac{1}{s}\sqrt{\frac{L_1}{C_1}} = \frac{1}{s}\rho_1 \sim R_L, \quad (4)$$

where $$\rho_1 = \sqrt{\frac{L_1}{C_1}}$$

is the circuit impedance of SPDM 630.

As discussed above, to flatten the output pulse top, the circuit frequency of MPDM 635 may be approximately three times that of SPDM 630, resulting in $$\sqrt{L_1 C_1} \sim 3\sqrt{L_2 C_2}. \quad (5)$$

If power delivery modules are designed to keep inductance low (in order to achieve fast pulses), the inductance ($L_1$ 634 and $L_2$ 639) of both power delivery modules may be approximately the same $$L_2 \sim L_1. \quad (6)$$

Based on Equations (5) and (6) an estimate for the capacitance of an MPDM as a function of the capacitance of an SPDM is $$C_2 \sim 1/9 C_1. \quad (7)$$

Simulations show that if the conditions (4)-(6) are satisfied, the standard and modified power delivery modules discharge into the load $R_L$ as if they were almost independent of each other. Then the amplitude of the current delivered by s SPDM into the matched load $R_L$ is $$I_1 \sim 0.5 \frac{V}{\rho_1} s. \quad (8)$$

While the amplitude of the current $I_2$ delivered by the m (<s) MPDMs into the load $$R_L \sim \frac{\rho_1}{s} \sim \frac{m}{3s}\frac{\rho_2}{m} < 0.33\frac{\rho_2}{m}, \text{ is } I_2 \sim 0.9\frac{V}{\rho_2}m. \quad (9)$$

This is because the load that the MPDMs see, $R_L$, is much smaller (under matched) than their characteristic impedance $$\rho_2 = \sqrt{\frac{L_2}{C_2}}.$$

Equations (5)-(9) indicate that the shape of the load pulse (defined by the coefficient a in Eq. (3)) depends on the ratio of the number of standard and modified power delivery modules in the cavity, because $$a = \frac{I_1}{I_2} \sim 0.55 \frac{\rho_2}{\rho_1}\frac{s}{m} \sim 1.65 \frac{s}{m}. \quad (10)$$

Although Equation (10) indicates that coefficient a is theoretically ~1.65 (s/m), Equation (10) may need to be modified depending on real-world factors. In one embodiment where TDK ceramic capacitors are used in a power delivery module, Equation (10) may be modified to $$a \sim 3\frac{s}{m}. \quad (11)$$

Factors such as resistance in capacitors may require Equation (10) to be adjusted to accommodate a specific physical embodiment. Energy losses associated with the core (e.g. cavity core 415) may also require the tuning of Equation (10) to achieve the desire flat-top pulse waveform. Some simulations indicate that the top of the combined output pulse may rise or fall depending on the inductance of the MPDMs. This may be because at a given load resistance, this inductance determines the amplitude of a second current peak produced by the MPDMs coupled to the load.

As shown in Equation (7), the calculated capacitance of the MPDMs may be about $\frac{1}{9}^{th}$ the capacitance of the SPDMs to achieve a flat-top pulse waveform to deliver to the load of an LTD. Because real-world factors may require a slightly different capacitance ratio, a capacitance of the MPDMs between eight and twelve times the capacitance of the SPDMs may be used to achieve a flat-top pulse waveform to deliver to the load. A capacitance ratio between eight and twelve may correspond with the SPDMs and the MPDMs having approximately the same inductance. This capacitance ratio with substantially the same inductance may configure the MPDMs to generate a pulse with a frequency approximately three times the frequency of a pulse delivered by the SPDMs. Also discussed above, the ratio of modified to standard power delivery modules in a cavity (e.g. HPPC 100) may define the shape of the combined output pulse delivered to the load. It is appreciated that a number of SPDMs and MPDMs may be connected in parallel in a cavity and triggered simultaneously to generate a combined pulse to be delivered to a load.

In one embodiment, HPPC 100 contains s=4 SPDMs 130 and m=2 MPDMs 135. However, because the shape of the load pulse depends on the ratio of the number of SPDMS to the number of MPDMs included in HPPC 100, the ratio may change depending on the specific application and desired shape of the load pulse. The specific configuration of SPDM 130 and MPDM 135 may take the form of SPDMs and MPDMs described in accordance with the disclosure.

If the SPDM and MPDM are configured similar to those in FIGS. 4A and 4B, the bottom capacitor (e.g. capacitor 422) of each SPDM and MPDM may be positioned in a bottom circular array and the top capacitors (e.g. capacitor 421) may be positioned in the cavity as a top circular array. In one embodiment, the top circular array is separated from the bottom circular array by a ~1 cm plastic insulator plate. The capacitors in the top circular array may be charged to a first voltage (e.g. 100 kV) and the bottom circular array may be charged to a second voltage (e.g. −100 kV).

In one embodiment, each SPDM and MPDM includes a multi-gap switch (e.g. switch 410) with corona discharge that is used to fire each power delivery module simultaneously. In one embodiment, the switches use dry air. The gas switches may be relatively quiet, which reduces mechanical shock that can significantly shorten the life of an assembly. In another embodiment, a different switch design may be used having only one or several gaps. Also, the switch gas may be different than dry air—it may be hydrogen or other suitable gas.

Figure 7:
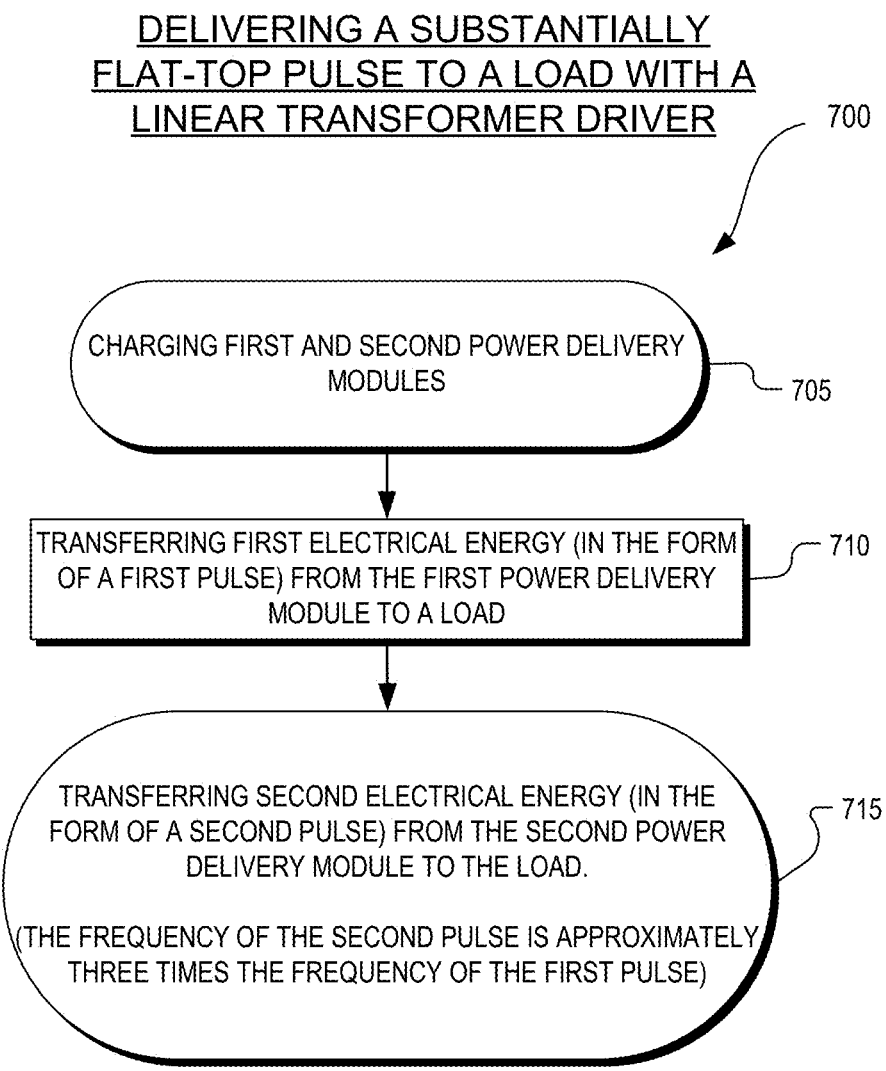
FIG. 7 illustrates a flowchart of an example process of operating a linear transformer driver, in accordance with an embodiment of the disclosure.

FIG. 7 illustrates a flowchart of an example process 700 for operating an LTD, in accordance with an embodiment of the disclosure. The order in which some or all of the process blocks appear in process 700 should not be deemed limiting. Rather, one of ordinary skill in the art having the benefit of the present disclosure will understand that some of the process blocks may be executed in a variety of orders not illustrated, or even in parallel.

In process block 705, first and second power delivery modules (e.g. SPDM and MPDM) are charged. The first power delivery module is charged to a first electrical energy level and the second power delivery module is charged to a second electrical energy level. In one embodiment, the first and second energy level is approximately the same. Charging circuitry may be connected in parallel to charge the first and second power delivery modules to approximately the same level. The first and second power delivery module may each contain one or two charge storage devices, as shown in the embodiments depicted in FIG. 3 and FIG. 4A-4B. If the first and second power delivery modules are configured similar to the embodiment in FIG. 4A-4B, one capacitor (e.g. capacitor 421) may be charged to a first voltage level (e.g. 100 kV) and a second capacitor (e.g. capacitor 422) may be charged to a second voltage level (e.g. −100 kV).

In process block 710, first electrical energy is transferred from the first power delivery module to a load, in the form of a first pulse. In process block 715, the second electrical energy is transferred from the second power delivery module to the load, in the form of a second pulse. The first pulse has a first frequency and the second pulse has a second frequency approximately three times the first frequency. The first pulse and the second pulse combine to deliver a pulse with a substantially flat top to the load. A ferrite core that encircles conductors that deliver the first and second pulses may act as a choke and force the pulses to be delivered to the load electromagnetically by temporarily delaying the first and second pulse from going to ground.

The first and second electrical energy may be transferred simultaneously. The first power delivery module and the second power delivery module may receive a trigger signal causing the first pulse and the second pulse to propagate to the load simultaneously. The first power delivery module may include a first switch coupled to transfer the first electrical energy to the load, and the second power delivery module may include a second switch coupled to transfer the second electrical energy to the load.

One additional process block of process 700 may include pressurizing the first switch and the second switch with refrigerated air prior to transferring the first electrical energy and the second electrical energy to the load. Another additional process block of process 700 may include de-magnetizing the ferrite core after transferring the first electrical energy and the second electrical energy.

Figure 8:
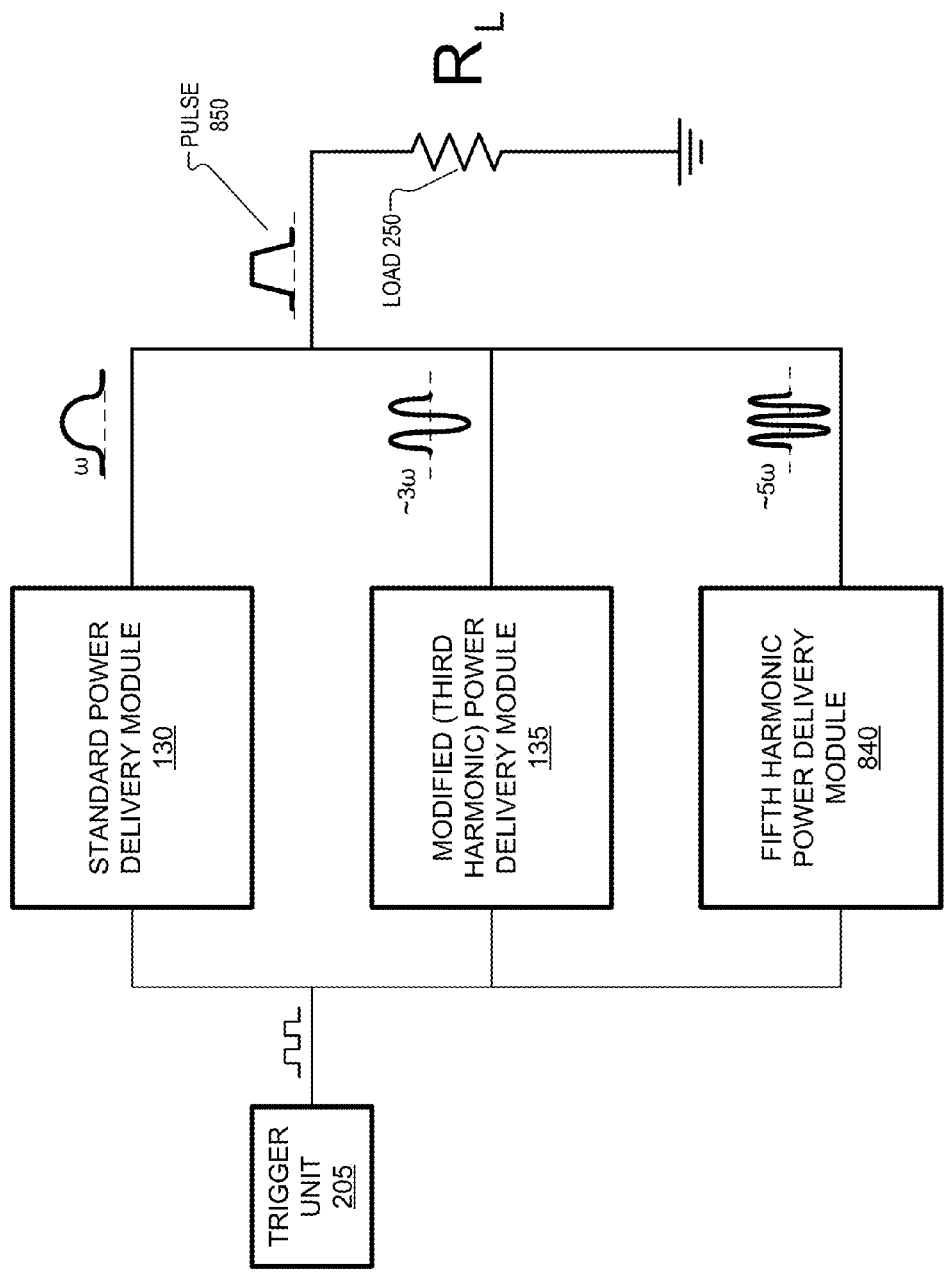
FIG. 8 shows an example block diagram schematic including an SPDM generating a first pulse, an MPDM generating a second pulse, and a Fifth Harmonic Power Delivery Module ("FHPDM") generating a third pulse that combines with the first pulse and the second pulse to form a pulse with a substantially flat-top, which is delivered to a load, in accordance with an embodiment of the disclosure.

FIGS. 8-11 illustrate an additional linear transformer driver embodiment of the disclosure that includes one or more Fifth Harmonic Power Delivery Modules. FIG. 8 shows an example block diagram schematic including SPDM 130 generating a first pulse, MPDM 135 generating a second pulse, and a Fifth Harmonic Power Delivery Module ("FHPDM") 840 generating a third pulse that combines with the first pulse and the second pulse to form a pulse 850 with a substantially flat-top, which is delivered to load 250, in accordance with an embodiment of the disclosure. FHPDM 840, SPDM 130, and MPDM 135 are all connected in parallel. MPDM 135 generates the second pulse to be applied to load 250 that is approximately three times the frequency of the first pulse generated by SPDM 130 and FHPDM 840 generates a third pulse to be applied to load 250 that is approximately five times the frequency of the first pulse generated by SPDM 130. In the illustrated embodiment, trigger unit 205 is coupled to SPDM 130, MPDM 135 and FHPDM 840. Trigger unit 205 sends a trigger signal to SPDM 130, MPDM 135, and FHPDM 840 to deliver a pulse to the load $R_L$ 250. In the illustrated embodiment, the trigger pulse is delivered to SPDM 130, MPDM 135, and FHPDM 840 simultaneously since they are illustrated as connected in parallel. However, in one embodiment, trigger pulses from trigger unit 205 may be delivered separately to each power delivery module, and the separate trigger pulses may be staggered in time. Because the outputs of SPDM 130, MPDM 135, and FHPDM 840 are connected in parallel in FIG. 2, their pulses combine into pulse 850 with a relatively flat top. It is appreciated that although the load $R_L$ 250 is illustrated as a resistor, the load receiving the pulse may not be purely resistive.

Figure 9:
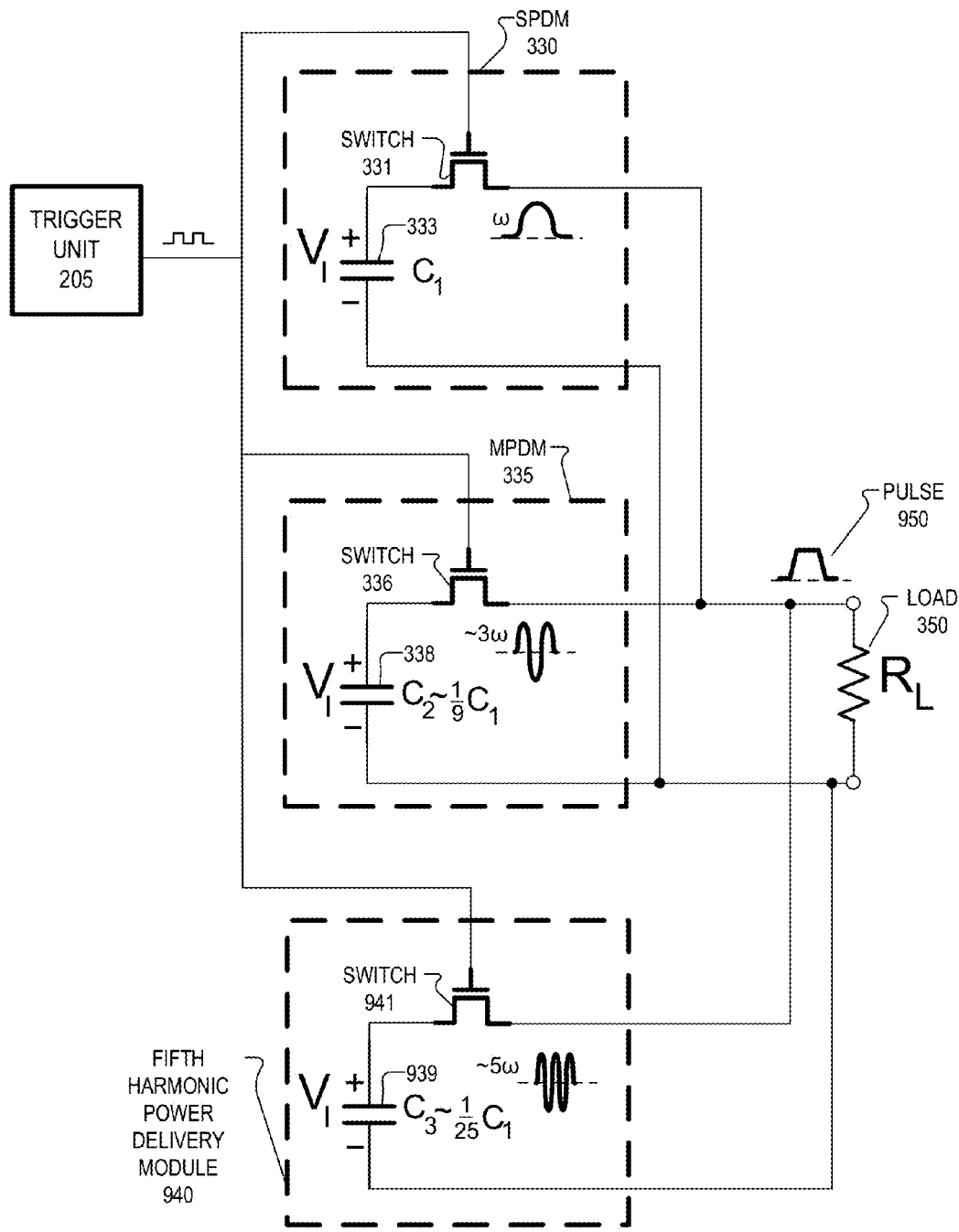
FIG. 9 shows an example block diagram illustrating one example configuration of a trigger unit, an SPDM, an MPDM, and an example FHPDM in accordance with an embodiment of the disclosure.

FIG. 9 shows an example block diagram illustrating one example configuration of trigger unit 205, SPDM 330, MPDM 335, and an example FHPDM 940, in accordance with an embodiment of the disclosure. FIG. 9 is similar to FIG. 3, except that FIG. 9 also includes FHPDM 940. FHPDM 940 is one possible example of FHPDM 840. The illustrated embodiment of FHPDM 940 includes a capacitor ($C_3$ 939) coupled to a switch 941. Capacitor $C_1$ 333 has a capacitance that is approximately twenty-five times the capacitance of capacitor $C_3$ 939 because this capacitance value will generate a pulse with a frequency approximately five times greater than the pulse from SPDM 330, assuming the inductance of the power delivery modules are the same or similar. $C_3$ 939 is charged to a voltage $V_f$ and switch 941 is activated by trigger unit 205, which allows $C_3$ 939 to discharge and generate a pulse to be delivered to load 350. In the illustrated embodiment, $C_3$ 939, $C_2$ 338, and $C_1$ 333 are all charged to the same voltage ($V_f$), but they may be charged to different voltages. The charging circuit and hardware that may be used to charge $C_2$ 338 is not shown as to not obscure the schematic. The frequency of the pulse delivered by FHPDM 940 is ~5ω, as illustrated. Experiments and theory indicate that having FHPDM 940 configured to deliver a pulse that is approximately five times the frequency (ω) of the pulse delivered by SPDM 330 while having MPDM 335 configured to deliver a pulse that is approximately three times the frequency of a pulse delivered by SPDM 330 creates a pulse 950 with a substantially flat top and faster rise time.

In the illustrated embodiment, trigger unit 205 is coupled to switches 331, 336, and 941 in parallel. In other examples, switch 331, switch 336, and switch 941 may be coupled to trigger unit 205 individually, with separate conductors. Switch 941 may be the same as switches 331 or 336. In the illustrated embodiment, trigger unit 205 may broadcast a trigger signal to switches 331, 336, and 941 which will trigger SPDM 330, MPDM 335, and FHPDM 940 to deliver their pulses simultaneously. In other examples, 331, 336, and 941 may receive a trigger signal from trigger unit 205 at different times. Trigger unit 205 may be configured to deliver triggering signals (either analog or digital) to switches 331, 336, and 941 at different times in order to stagger the pulses delivered to load 350 to achieve a desired waveform. It shall be appreciated that trigger unit 205 may also be connected to more than one (i.e. arrays) of SPDM 330, MPDM 335, and FHPDM 940 in order to orchestrate or synchronize the delivery of multiple pulses to load 350. FHPDM 940 can be configured similarly to the embodiments shown in FIGS. 4A-5. The configuration of FIG. 9 has advantages over the configuration of FIG. 3 in some applications. More specifically, the configuration of FIG. 9 is capable of generating a pulse 950 that has a faster rise time and a flatter and longer duration pulse top. Adding FHPDM 940 contributes a pulse with a frequency that is five times the frequency of the pulse from SPDM 330. Pulse 950 is generated by the superposition of the first pulse from SPDM 330, the second pulse from MPDM 335, and the third pulse from FHPDM 940.

Experiments and simulations have indicated particular configurations of the power delivery modules that may be particularly suited to generate a desirable pulse 950. For description purposes, let s represent the number of SPDMs 330 in a first array of SPDMs 330, let m represent the number of MPDMs 335 in a second array of MPDMs 335, and let ƒ represent the number of FHPDMs included in a linear transformer driver. Applicant's analysis suggests that the flat-top width (duration) of pulse 950 can be increased while decreasing the rise time of pulse 950 when the following conditions are fulfilled:

$$0.5 \le \frac{m}{s} \le 0.7, \frac{f}{s} = \frac{m}{s} - 0.4 \quad (12)$$

Considering these conditions, a cavity that includes a configuration of 10s+5m+1f, 10s+6m+2f, or 10s+7m+3f may produce the most desirable shape and duration of pulse 950. Increasing the number of MPDMs 335 and FHPDMs 940 reduces the peak output voltage amplitude and the rise time of pulse 950, but also increases the width (duration) of pulse 950. Since meeting the conditions described in equation (12) requires having an increased number of MPDMs 335 compared to the 4s+2m configuration disclosed in connection with FIGS. 1-7, the cavity (e.g. cavity 100) may be considerably larger to accommodate the increased number of power delivery modules. In some contexts, it may be preferable to incorporate the largest number of FHPDMs physically allowed by a given cavity dimension, while still adhering to the conditions of equation (12).

FIG. 1B illustrates an embodiment that includes four SPDMs 130 and two MPDMs 135 that are positioned radially around core 115. Embodiments that include FHPDM(s) 940 may also have each power delivery module positioned radially around the core to keep the conductor length between the core and each power delivery module as similar as possible. FHPDM 940 can be configured similarly to the embodiments shown in FIGS. 4A-5 (including the dual capacitor configuration) to facilitate the similar conductor lengths in relation to 415. In one embodiment that includes the dual capacitor configuration of FIG. 4B, the capacitors for the SPDMS have values of 12 nF, the capacitors for the MPDMs have values of 1.4 nF, and the capacitors for the FHPDM(s) have values of 0.5 nF. Although FIG. 9 does not depict a core (e.g. cavity core 115/415), those skilled in the art appreciate that a core may encircle conductors that are routed toward load 350.

Figure 10:
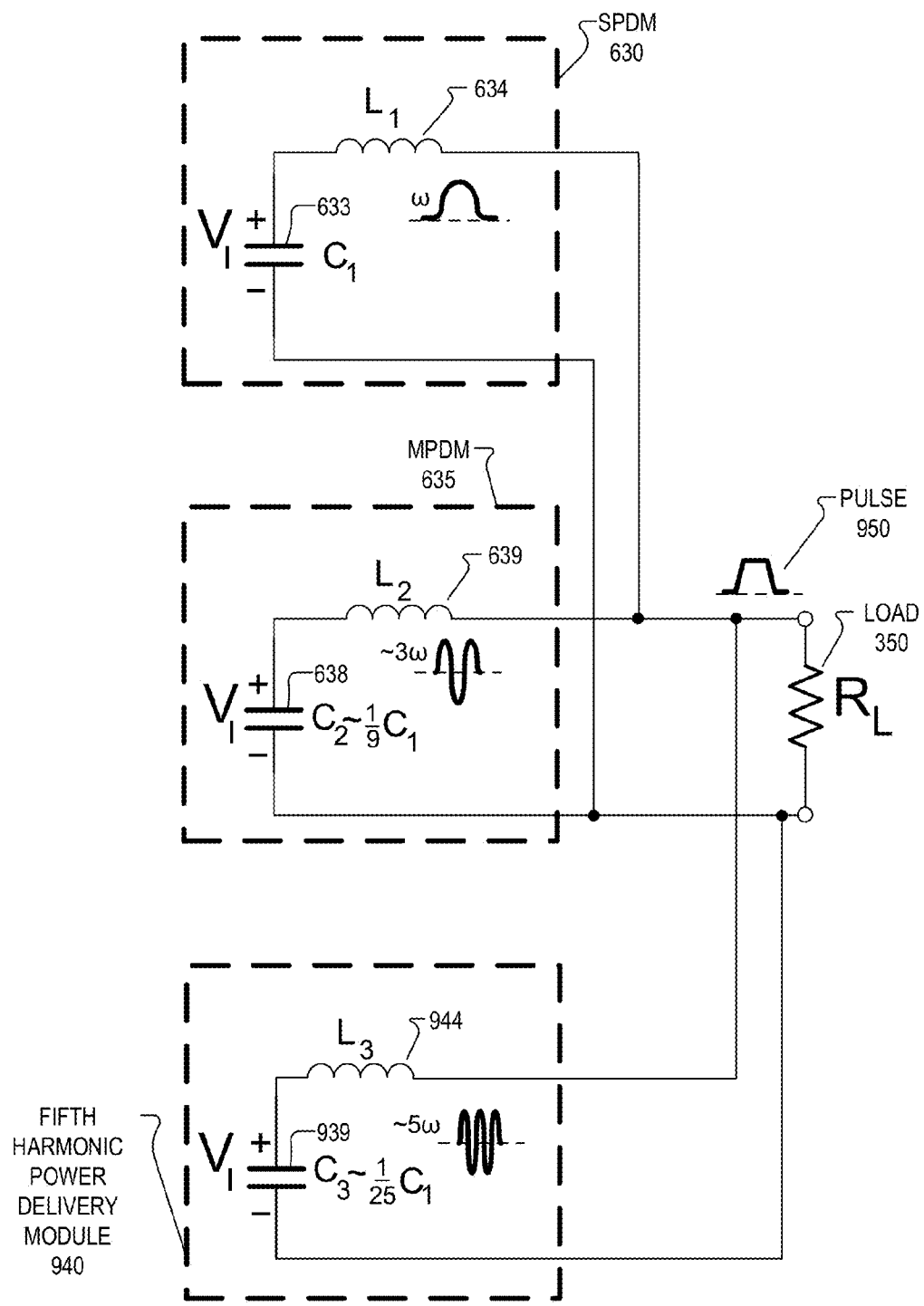
FIG. 10 shows a block diagram schematic that models the electrical characteristics of an example SPDM, an example MPDM, and an example FHPDM in accordance with an embodiment of the disclosure.

The simplified block diagram electrical circuit that models the electrical characteristics of an example SPDM (e.g. SPDM 330 and 530) and an example MPDM (e.g. MPDM 335 and 535) and example FHPDM 940 is shown in FIG. 10. FIG. 10 includes capacitors ($C_1$) 633, ($C_2$) 638, ($C_3$) 939 and inductors ($L_1$) 634, ($L_2$) 639, and ($L_3$) 944 that model the capacitance and inductance of SPDM 630, MPDM 635, and FHPDM 940, respectively. The inductors ($L_1$) 634, ($L_2$) 639, and ($L_3$) 944 model the inductance between the power delivery module and the load and their values may be substantially driven by the conductors between the load and the power delivery modules. The inductance modeled by ($L_1$) 634, ($L_2$) 639, and ($L_3$) 944 may be substantially the same (e.g. 200 nH), in some embodiments. FIG. 10 may also be an appropriate model for an LTD that has an array of SPDMs 630, an array of MPDMs 635, and at least one FHPDM 940 connected in parallel to deliver pulse 950 to load 650. To model that case, capacitor 633 would be multiplied by s (which signifies the number of SPDMs 630 in the array) and inductor 634 would be divided by s. Also in that case, capacitor 638 would be multiplied by m (which signifies the number of MPDMs 635 in the array) and inductor 639 would be divided by m. Similarly, capacitor 939 would be multiplied by ƒ (which signifies the number of FHPDMs 940) and inductor 944 would be divided by ƒ.

Figure 11:
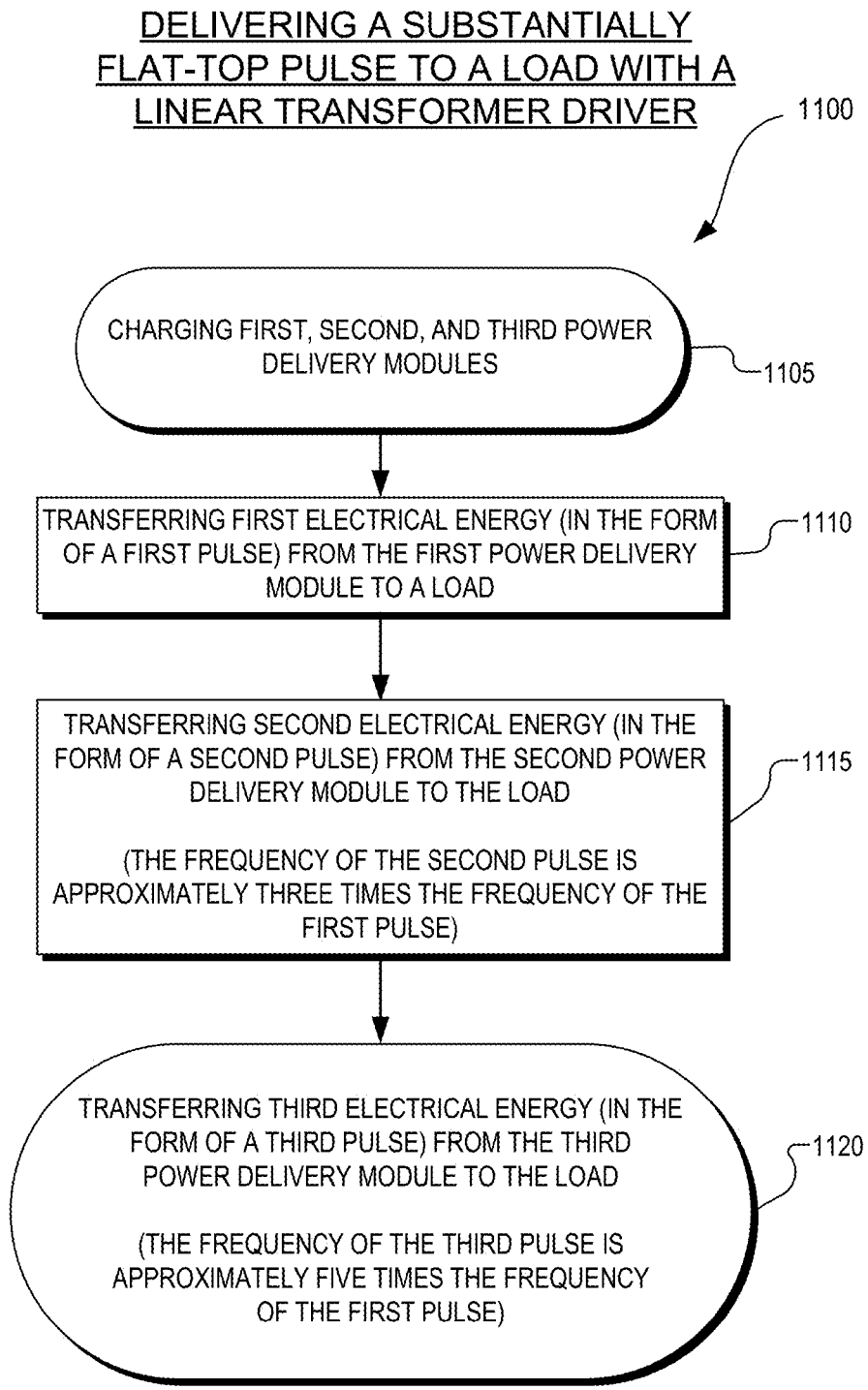
FIG. 11 illustrates a flowchart of an example process of operating a linear transformer driver, in accordance with an embodiment of the disclosure.

FIG. 11 illustrates a flowchart of an example process 1100 of operating a linear transformer driver, in accordance with an embodiment of the disclosure. The order in which some or all of the process blocks appear in process 1100 should not be deemed limiting. Rather, one of ordinary skill in the art having the benefit of the present disclosure will understand that some of the process blocks may be executed in a variety of orders not illustrated, or even in parallel.

In process block 1105, first, second, and third power delivery modules (e.g. SPDM, MPDM, FHPDM) are charged. The first power delivery module is charged to a first electrical energy level, the second power delivery module is charged to a second electrical energy level, and the third power delivery module is charged to a third electrical energy level. In one embodiment, the first, second, and third electrical energy levels are approximately the same. Charging circuitry may be connected in parallel to charge the first, second, and third power delivery modules to approximately the same level. The first, second, and third power delivery module may each contain one or two charge storage devices, as shown in the embodiments depicted in FIG. 9 and FIG. 4A-4B. If the first, second, and third power delivery modules are configured similar to the embodiment in FIG. 4A-4B, one capacitor (e.g. capacitor 421) may be charged to a first voltage level (e.g. 100 kV) and a second capacitor (e.g. capacitor 422) may be charged to a second voltage level (e.g. −100 kV).

In process block 1110, first electrical energy is transferred from the first power delivery module to a load, in the form of a first pulse. In process block 1115, the second electrical energy is transferred from the second power delivery module to the load, in the form of a second pulse. In process block 1120, the third electrical energy is transferred from the third power delivery module to the load, in the form of a third pulse. Process blocks 1110, 1115, and 1120 may be performed or executed in parallel. The first pulse has a first frequency, the second pulse has a second frequency approximately three times the first frequency, and the third pulse has a third frequency approximately five times the first frequency. The first, second, and third pulse combine to deliver a pulse with a substantially flat top to the load. A ferrite core that encircles conductors that deliver the first, second, and third pulses may act as a choke and force the pulses to be delivered to the load electromagnetically by temporarily delaying the first, second, and third pulse from going to ground.

The first, second, and third electrical energy may be transferred simultaneously. The first power delivery module, the second power delivery module, and the third power delivery module may receive a trigger signal causing the first, second, and third pulses to propagate to the load simultaneously. The first power delivery module may include a first switch coupled to transfer the first electrical energy to the load, the second power delivery module may include a second switch coupled to transfer the second electrical energy to the load, and the third power delivery module may include a third switch coupled to transfer the third electrical energy to the load.

One additional process block of process 1100 may include pressurizing the first switch, the second switch, and the third switch with refrigerated air prior to transferring the first, second, and third electrical energy to the load. Another additional process block of process 1100 may include de-magnetizing the ferrite core after transferring the first, second, and third electrical energy.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A linear transformer driver comprising:
   a core including ferrite rings positioned to accept a load within a center of the ferrite rings;
   a first array of Power Delivery Modules ("PDMs"), wherein each of the PDMs in the first array is coupled to deliver a first pulse having a first frequency to the load;
   a second array of Modified Power Delivery Modules ("MPDM"), wherein each of the MPDMs in the second array is coupled to deliver a second pulse having a second frequency to the load, wherein the second frequency is approximately three times the first frequency; and
   at least one Fifth Harmonic Power Delivery Module ("FHPDM"), wherein the at least one FHPDM is coupled to deliver a third pulse having a third frequency to the load, wherein the third frequency is approximately five times the first frequency, the core configured to electromagnetically force the first pulse, the second pulse, and the third pulse to the load by temporarily isolating the first pulse, the second pulse, and the third pulse from an electrical ground.

2. The linear transformer driver of claim 1, wherein s represents a number of PDMs in the first array, m represents a number of MPDMs in the second array, and $f$ represents a number of FHPDMs, and wherein m divide by s is between 0.5 and 0.7, and further wherein $f$ divided by s is approximately equal to m divided by s subtracted by 0.4.

3. The linear transformer driver of claim 1, wherein each PDM includes first charge storing elements having a first capacitance, each MPDM includes second charge storing elements having a second capacitance, and each FHPDM includes third charge storing elements having a third capacitance, and wherein the first capacitance is between eight and twelve times the second capacitance and approximately twenty-five times the third capacitance.

4. The linear transformer driver of claim 3, wherein the first charge storing elements, the second charge storing elements, and the third charge storing elements are coupled to be charged by charging circuitry.

5. The linear transformer driver of claim 1, wherein the PDMs, the MPDMs, and the at least one FHPDMs are positioned radially around the core to provide similar conductor length from the core to the PDMs, the MPDMs, and the FHPDMs.

6. The linear transformer driver of claim 1, wherein each PDM, MPDM, and FHPDM includes a first conductor and a second conductor, wherein the first conductors are routed through a first ferrite ring of the core to a chassis of the linear transformer driver, and wherein the second conductors are routed through a second ferrite ring of the core to the chassis.

7. The linear transformer driver of claim 6, wherein the chassis is a substantially doughnut-shaped metal chassis that encloses the PDMs, the MPDMs, and the at least one FHPDM, and wherein the first ferrite ring and the second ferrite ring encircle an inner cylindrical surface of the substantially doughnut-shaped metal chassis.

8. The linear transformer driver of claim 6, wherein the linear transformer driver is configured to deliver the first pulse, the second pulse, and the third pulse to the load across an anode-cathode gap between the inner cylindrical surface of the substantially doughnut-shaped metal chassis and the load, wherein the load is to be a cylindrical electrode.

9. The linear transformer driver of claim 6, wherein the first ferrite ring is stacked co-axially with the second ferrite ring.

10. The linear transformer driver of claim 1 further comprising a trigger unit coupled to transmit a trigger signal to the PDMs, the MPDMs, and the at least one FHPDM.

11. The linear transformer driver of claim 10, wherein each of the PDMs, the MPDMs, and the at least one FHPDM include a switch coupled to receive the trigger signal.

12. A linear transformer driver comprising:
at least one ferrite ring positioned to accept a load within a center of the at least one ferrite ring;
a first power delivery module including a first charge storage device and a first switch coupled to selectively transfer a first charge, in the form of a first pulse, from the first charge storage device to a first conductor routed to deliver a first energy from the first pulse to the load;
a second power delivery module including a second charge storage device and a second switch coupled to selectively transfer a second charge, in the form of a second pulse, from the second charge storage device to a second conductor routed to deliver a second energy from the second pulse to the load; and
a third power delivery module including a third charge storage device and a third switch coupled to selectively transfer a third charge, in the form of a third pulse, from the third charge storage device to a third conductor routed to deliver a third energy from the third pulse to the load, wherein the linear transformer driver is configured to form a square pulse by the superposition of the first, second, and third pulses, wherein the first, second, and third pulses having different frequencies.

13. The linear transformer driver of claim 12, wherein the second pulse has a second frequency approximately three times a first frequency of the first pulse, and wherein the third pulse has third frequency approximately five times the first frequency.

14. The linear transformer driver of claim 12, wherein the at least one ferrite ring is positioned to electromagnetically transfer the first energy, the second energy, and the third energy to the load.

15. The linear transformer driver of claim 12, wherein the at least one ferrite ring is configured to be saturated by the first energy from the first pulse, the second energy from the second pulse, and the third energy from the third pulse for between 75 and 200 ns.

16. The linear transformer driver of claim 12 further comprising a trigger unit coupled to transmit a trigger signal to the first, second, and third power delivery modules.

17. A method of delivering a substantially flat-top pulse to a load with a linear transformer driver, the method including:
charging a first, a second, and a third power delivery module to a first, a second, and a third electrical energy, respectively;
transferring the first electrical energy from the first power delivery module to a load via a first pulse;
transferring the second electrical energy from the second power delivery module to the load via a second pulse; and
transferring the third electrical energy from the third power delivery module to the load via a third pulse, wherein the substantially flat-top pulse is formed by the superposition of the first, second, and third pulses, wherein the first, second, and third pulses having different frequencies.

18. The method of claim 17, wherein the second pulse has a second frequency approximately three times a first frequency of the first pulse, and wherein the third pulse has third frequency approximately five times the first frequency.

19. The method of claim 17, wherein said transferring of the first, second, and third electrical energy is initiated simultaneously.

20. The method of claim 17 further comprising:
de-magnetizing a ferrite core of the linear transformer driver after transferring the first, second, and third electrical energy to the load.

* * * * *